(12) United States Patent
Shim et al.

(10) Patent No.: US 6,225,764 B1
(45) Date of Patent: May 1, 2001

(54) LINEARITY CORRECTION COIL DEVICE AND VIDEO DISPLAY APPARATUS USING THE SAME

(75) Inventors: Jae-Gyou Shim; Yong-Su Ha, both of Suwon (KR)

(73) Assignee: SamSung Electronics Co., Ltd., Suwon (KR)

(*) Notice: Subject to any disclaimer, the term of this patent is extended or adjusted under 35 U.S.C. 154(b) by 0 days.

(21) Appl. No.: 09/349,488

(22) Filed: Jul. 9, 1999

(30) Foreign Application Priority Data

Jul. 14, 1998 (KR) .................................................. 98/28449
Jul. 14, 1998 (KR) .................................................. 98/28450

(51) Int. Cl.$^7$ ...................................................... G09G 1/04
(52) U.S. Cl. .................... 315/370; 315/368.25; 313/440
(58) Field of Search ............................... 315/370, 368.25, 315/368.28, 371; 313/421, 440

(56) References Cited

U.S. PATENT DOCUMENTS

| 4,037,256 | * | 7/1977 | Costa | 358/248 |
|---|---|---|---|---|
| 4,393,361 | * | 7/1983 | Horton | 335/212 |
| 4,423,358 | * | 12/1983 | Den Hollander | 315/371 |
| 5,065,186 | | 11/1991 | Valenti | 315/371 |
| 5,072,161 | * | 12/1991 | Ikeda et al. | 315/371 |
| 5,350,980 | | 9/1994 | Dye et al. | 315/370 |
| 5,473,299 | * | 12/1995 | Tsutsumi et al. | 315/400 |
| 5,675,213 | | 10/1997 | Huang et al. | 313/440 |
| 5,777,697 | | 7/1998 | Baek | 315/370 |
| 6,013,989 | * | 1/2000 | Lee | 315/370 |

* cited by examiner

*Primary Examiner*—Don Wong
*Assistant Examiner*—Thuy Vinh Tran
(74) *Attorney, Agent, or Firm*—Robert E. Bushnell, Esq.

(57) ABSTRACT

A linearity correction coil device and a video display apparatus using the same are disclosed. In a video display apparatus having a cathode-ray tube, a deflecting yoke for deflecting the electron beam and a linearity correction coil device for compensating a linearity of the electron beam, the linearity correction coil device is horizontally installed on a printed circuit board for the cathode-ray tube, and wherein a vertical length of said linearity correction coil in an intersecting direction to a progressive direction of the electron beam has a shorter length than a horizontal length of said linearity correction coil device in a parallel direction to the progressive direction of the electron beam. Accordingly, it is able to prevent the electron beam from running off a normal orbit by a magnetic field generated from the linearity correction coil device. Therefore, since the electron beam exactly collides with fluorescent material, it is able to prevent a stained image from showing on the cathode-ray tube. In addition, since the manufacturing process of the linearity correction coil device is simplified, the productivity and the cost of the linearity correction coil device decrease.

15 Claims, 11 Drawing Sheets

LINEARITY CORRECTION COIL DEVICE AND VIDEO DISPLAY APPARATUS USING THE SAME

CLAIM OF PRIORITY

This application makes reference to, incorporates the same herein, and claims all benefits accruing under 35 U.S.C. §119 from an application for Linearity Correction Coil Device and Video Display Apparatus Using The Same earlier filed in the Korean Industrial Property Office on Jul. 14, 1998 and there duly assigned Serial Nos. 28450/1998 and 28449/1998.

1. Field of the Invention

The present invention relates to alinecrity correction coil device of a video display apparatus, and more particularly, to a linearity correction coil device and a video display apparatus using the same, which are capable of increasing resolution of a video displayed on a cathode-ray tube (hereinafter, referred to as CRT) by improving a structure of the linearity correction coil device installed on a printed circuit board for the CRT and an installation method thereof.

2. Description of the Prior Art

In general, a computer system adopts the CRT as a device for displaying a video. The CRT display contains circuitry containing a horizontal/vertical deflector. This horizontal/vertical deflector contains a horizontal deflecting yoke coil and a linearity coil in series with the horizontal deflecting yoke coil. As is generally the case, the linearity coil is either placed on the neck of the CRT or located on a printed circuit board beneath the CRT. U.S. Pat. No. 5,350,980 for a Nonlinear Inductor With Magnetic Field Reduction to Dye et al. discloses the linearity coil placed in a vertical direction on the printed circuit board, allowing magnetic flux lines from the coil to interact with the electron beams inside the CRT causing deflection of the electron beam.

What is needed is an arrangement whereby there is little or no unwanted interaction between the linearity coil and the electron beams within the CRT. To achieve this, the linearity coil can be placed on its side instead of in an up-and-down direction. With this orientation of the linearity coil on the printed circuit board, deflection of electron beams inside the CRT is greatly reduced. In order to place a linearity coil on its side in a printed circuit board, a case for holding the linearity coil is needed to provide electrical connections between the linearity coil and the printed circuit board.

SUMMARY OF THE INVENTION

Therefore, it is an object of the present invention to provide a linearity correction coil device capable of increasing resolution of a video displayed on the CRT by improving a structure of the linearity correction coil device installed on a printed circuit board for the CRT.

It is another object of the present invention to provide a video display apparatus capable of increasing resolution of a video displayed on CRT by improving an installation method of the linearity correction coil device installed on a printed circuit board for the CRT.

It is still another object to orient the linearity coil on a printed circuit board sideways instead of up-and-down to reduce harmful interaction between the magnetic field generated by the linearity coil and the path of the electron beams inside the CRT.

It is yet another object to provide a holder for the linearity coil so that the linearity coil can establish discrete electrical connections with the printed circuit board.

In order to achieve the above objects, the present invention provides a video display apparatus using a linearity correction coil device, which comprises:
a cathode-ray tube for generating an electron beam;
a deflecting yoke for deflecting the electron beam; and
a linearity correction coil device, which is connected with said deflecting yoke in series, for compensating a linearity of the electron beam;
wherein said linearity correction coil device is installed on a printed circuit board for said cathode-ray tube, and wherein a vertical length of said linearity correction coil in an intersecting direction to a progressive direction of the electron beam has a shorter length than a horizontal length of said linearity correction coil device in a parallel direction to the progressive direction of the electron beam.

In order to achieve the above objects, the present invention provides a video display apparatus using a linearity correction coil device, which comprises:
a cathode-ray tube for generating an electron beam;
a deflecting yoke for deflecting the electron beam; and
a linearity correction coil device, which is connected with said deflecting yoke in series, for compensating a linearity of the electron beam;
wherein said linearity correction coil device comprises:
a linearity correction coil including a magnetic core having a first flange at one end portion of said magnetic core, a second flange at another end portion of said magnetic core, and a winding core portion for combining said first flange and said second flange; a winding wound around said winding core portion of said magnetic core; and a permanent magnet combined with either said first flange or said second flange, an axis extending through the center of said first flange, said second flange, said magnetic core, said winding, and said permanent magnet; and
a case for supporting said linearity correction coil placed on an upper surface of said case and having contact pins that one end portions of each of the contact pins are respectively connected with both end portions of said winding and other end portions of each of the contact pins are connected with said printed circuit board, wherein said linearity correction coil device is horizontally installed on a printed circuit board for said cathode-ray tube so that said axis is parallel to a surface on said printed circuit board wherein each point on said axis is equidistant from said surface of said printed circuit board.

In order to achieve the above objects, the present invention provides a video display apparatus using a linearity correction coil device, which comprises:
a cathode-ray tube for generating an electron beam;
a deflecting yoke for deflecting the electron beam; and
a linearity correction coil device, which is connected with said deflecting yoke in series, for compensating a linearity of the electron beam;
wherein said linearity correction coil device comprises:
a linearity correction coil including a magnetic core having a first flange at one end portion of said magnetic core, a second flange at another end portion of said magnetic core, and a winding core portion for combining said first flange and said second flange; a winding wound around said winding core portion of said magnetic core; and a permanent magnet combined with either said first flange or said second flange; and a case for supporting said linearity correction coil placed on an upper surface of said case and having guide grooves formed in both peripheral portions of a body thereof to guide both end portions of said winding, projections formed in a lower surface of said case and contact pins formed in the lower surface to be connected with the both end portions of said winding guided through the guide grooves, wherein said linearity correction coil device is horizontally installed on a printed circuit board for said cathode-ray tube for a vertical length which vertically intersects with a progressive direction of the electron beam to have a shorter length than a horizontal length which is parallel with the progressive direction of the electron beam.

In order to achieve the above objects, the present invention provides a linearity correction coil device, which comprises:

a linearity correction coil including a magnetic core having a first flange at one end portion of said magnetic core, a second flange at another end portion of said magnetic core, and a winding core portion for combining said first flange and said second flange; a winding wound around said winding core portion of said magnetic core; and a permanent magnet combined with either said first flange or said second flange; and a case for supporting said linearity correction coil placed on an upper surface of said case and having guide grooves formed in both peripheral portions of a body thereof to guide both end portions of said winding, projections formed in a lower surface of said case and contact pins formed in the lower surface to be connected with the both end portions of said winding guided through the guide grooves.

In the present invention, the linearity correction coil device for compensating the linearity of the electron beam is horizontally installed on a printed circuit board of the cathode-ray tube for the vertical length which vertically intersects with a progressive direction of the electron beam to have a shorter length than a horizontal length which is parallel with the progressive direction of the electron beam. Accordingly, it is able to prevent the electron beam from running off the normal orbit by the magnetic field generated from the linearity correction coil device. Therefore, since the electron beam exactly collides with the fluorescent material, it is able to prevent the stained image from showing on the CRT. In addition, the linearity correction coil device does not use the tape and the film to minimize shake thereof. Accordingly, since the manufacturing process of the linearity correction coil device is simplified, the productivity and the cost of the linearity correction coil device decrease.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols represent the same or similar components, wherein.

DETAILED DESCRIPTION OF THE INVENTION

Figure 1:
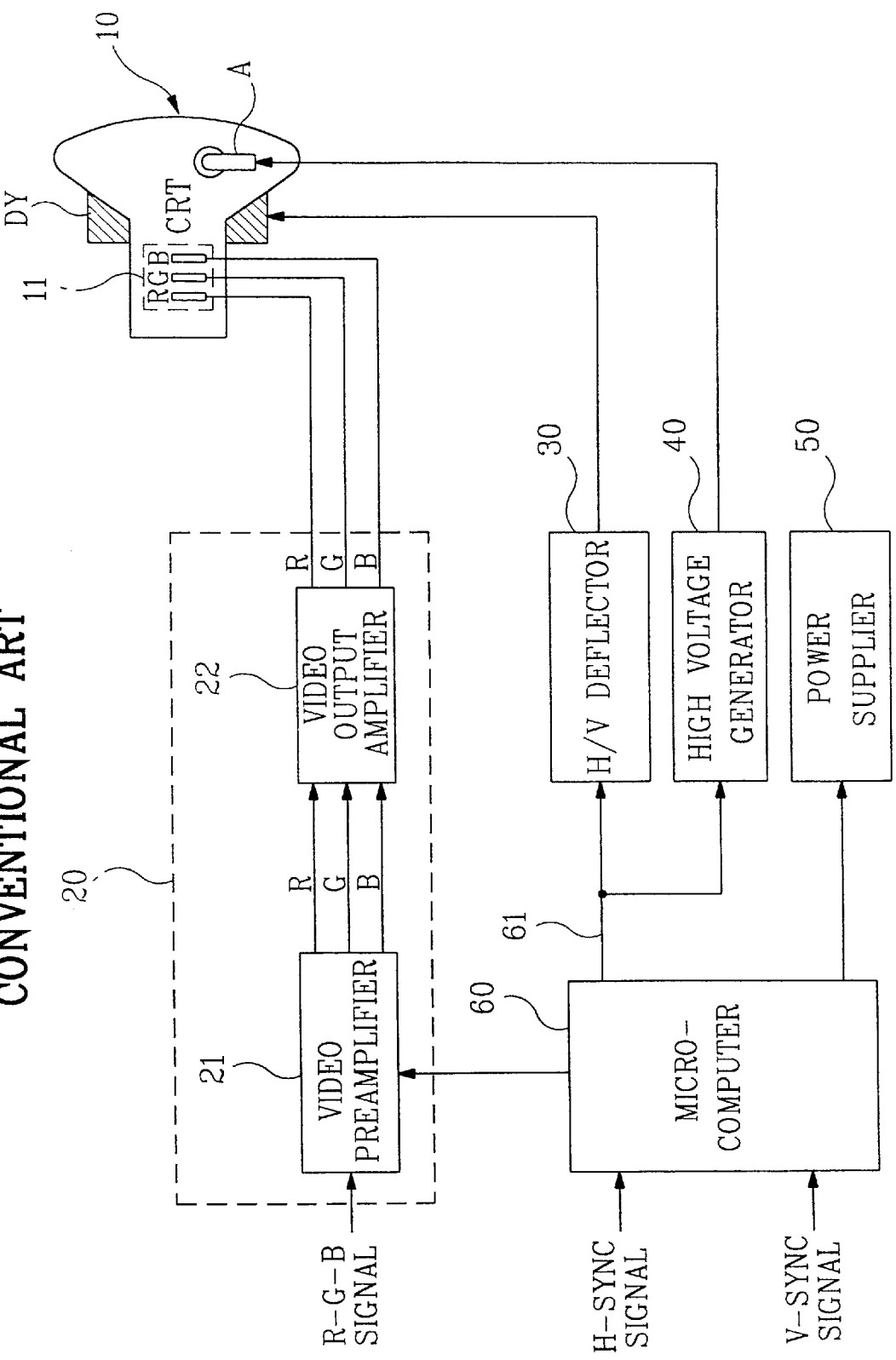
FIG. 1 is a block diagram showing the configuration of a conventional video display apparatus which adopts a cathode-ray tube.

FIG. 1 is a block diagram showing the configuration of a conventional video display apparatus which adopts the CRT. Referring to FIG. 1, the video display apparatus has a CRT 10 having three electrodes 11 corresponding to red, green and blue (hereinafter, referred to as R, G, B), an anode A for applying a high voltage from a high voltage generator 40 to CRT 10, a deflecting yoke DY for generating deflecting force to deflect an electron beam in response to a deflection signal from a horizontal/vertical deflector (hereinafter, referred to as H/V deflector) 30, a video processing section 20 having a video preamplifier 21 and a video output amplifier 22 for amplifying the R, G and B signal (hereinafter, referred to as R-G-B signal) and supplying the amplified R-G-B signal to three electrodes 11, a microcomputer 60 for respectively supplying a reference oscillation signal 61 to H/V deflector 30 and high voltage generator 40 in response to horizontal and vertical sync signals (hereinafter, referred to as IV sync signal) from an outside, and a power supplier 50 for supplying a power source.

Figure 2:
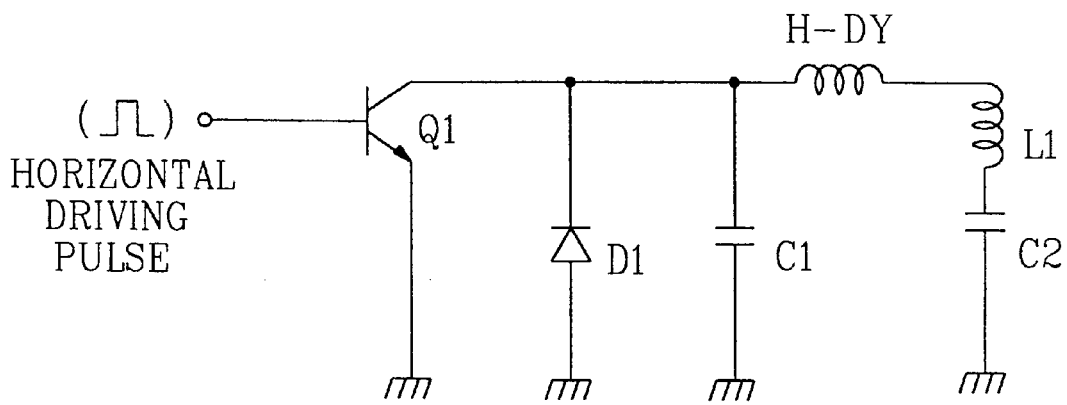
FIG. 2 is a circuit diagram showing the configuration of a circuit of the horizontal deflecting section shown in FIG. 1.

FIG. 2 is a circuit diagram showing the configuration of a circuit of the horizontal deflector of H/V deflector 30 shown in FIG. 1.

Referring to FIG. 2, first capacitor C1 repeatedly executes charge and discharge operations by a transistor Q1 which is switched in accordance with horizontal driving pulses synchronized with reference oscillation signal 61. Accordingly, a sawtooth wave signal is applied to the horizontal deflecting yoke H-DY which is connected with first capacitor C1 in parallel and the deflecting force for deflecting the electron beam in a horizontal direction occurs from horizontal deflecting yoke H-DY.

Figure 3:
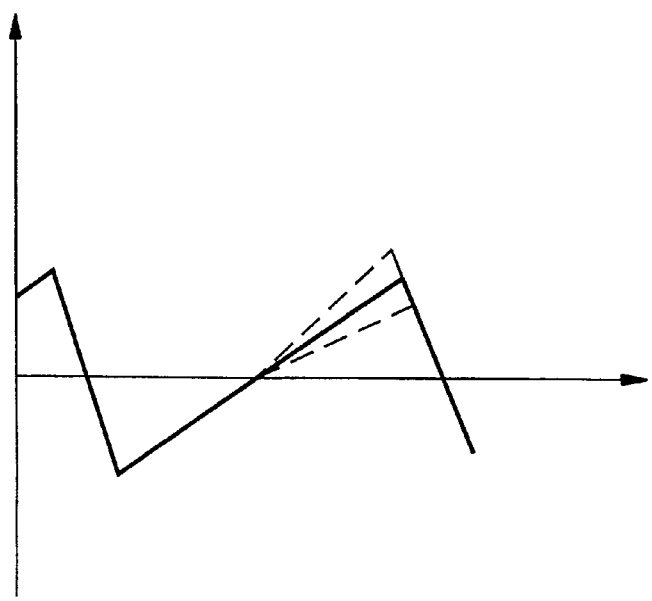
FIG. 3 is a waveform showing a sawtooth wave signal applied to the horizontal deflecting yoke shown in FIG. 2.

However, since the sawtooth wave signal applied to horizontal deflecting yoke H-DY has linearity as shown in FIG. 3 and the distance between three electrodes 11 and a fluorescent screen of CRT 10 is shorter than the distance among the three electrodes 11 and a circumference of a fluorescent screen, the sawtooth wave signal has to be compensated in a form of an S shaped.

To compensate the sawtooth wave signal in the form of the S shaped, second capacitor C2 is connected with horizontal deflecting yoke H-DY in series and a linearity correction coil device L1 is connected between horizontal deflecting yoke H-DY and second capacitor C2 in series. The linearity of the sawtooth wave signal is smoothed by linearity correction coil device L1 as shown in FIG. 3.

Figure 4:
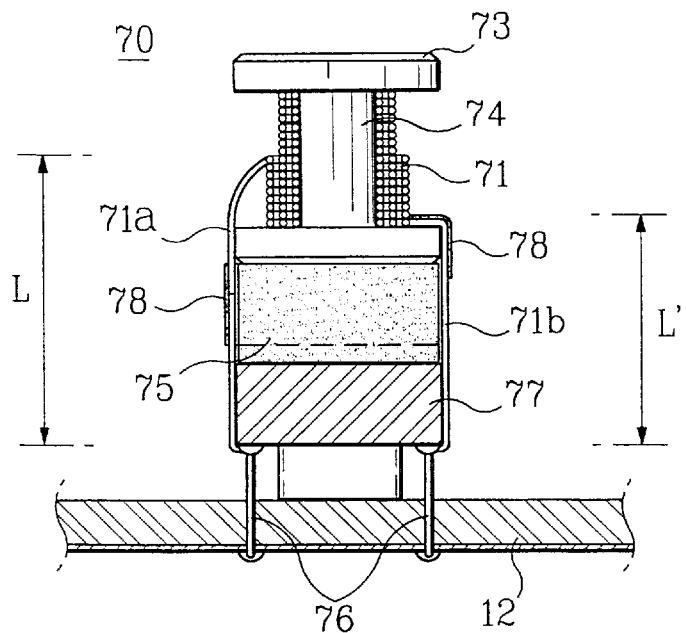
FIG. 4 is a sectional view showing structure of a prior linearity correction coil device.
Figure 5:
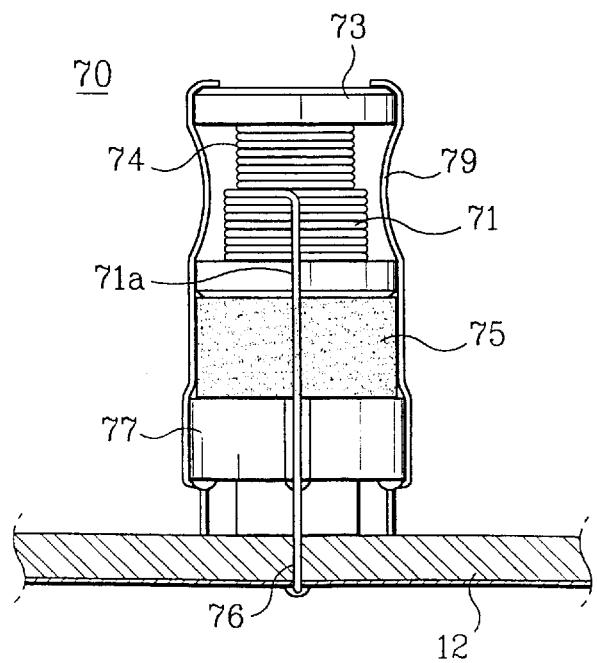
FIG. 5 is a view showing a final structure of the prior linearity correction coil device shown in FIG. 4.

FIG. 4 is a sectional view showing structure of a prior linearity correction coil device, and FIG. 5 is a view showing a final structure of the prior linearity correction coil device shown in FIG. 4.

Referring to FIGS. 4 and 5, the prior linearity correction coil device has a core 73 for winding a coil 71, a permanent magnet 75 combined with core 73, a sustaining member 77 combined with permanent magnet 75 and having a pair of contact pins 76. Both end portions of coil 71 are respectively combined with contact pins 76, linearity correction coil device 70 is installed on a printed circuit board 12 and contact pins 76 are combined with printed circuit board 12. Linearity correction coil device 70 is wrapped by a film 79 as shown in FIG. 5. The reference numeral 78 is a tape for fixing the shake of both end portions of coil 71.

Figure 6:
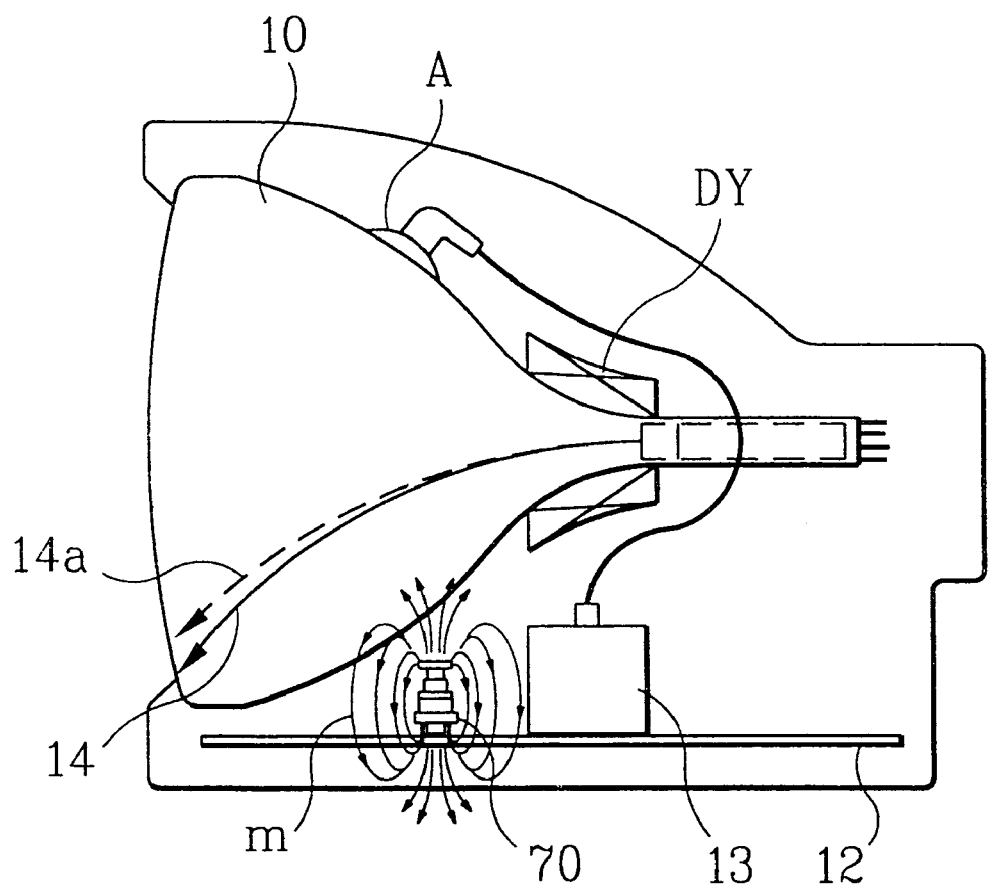
FIG. 6 is a view showing a configuration of the video display apparatus which adopts the prior linearity correction coil device.

As shown in FIG. 6, linearity correction coil device 70 is installed beside a flyback transformer 13 in a vertical way to minimize a space of linearity correction coil device 70 and an interference between linearity correction coil device 70 and peripheral components.

However, when linearity correction coil device 70 is installed on printed circuit board 12 in the vertical way, the distance between linearity correction coil device 70 and CRT 10 gets short. Consequently, the electron beam runs off a normal orbit and proceeds to an abnormal orbit by magnetic field which occurs from linearity correction coil device 70 as shown in FIG. 6.

Figure 7A:
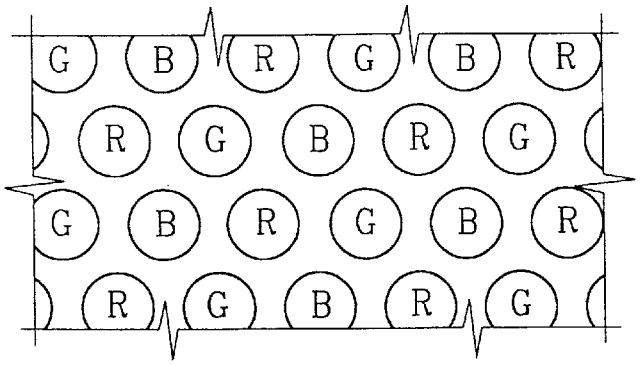
FIGS. 7A to 7C are views illustrating a stained phenomenon of a screen according to an electron beam.
Figure 7B:
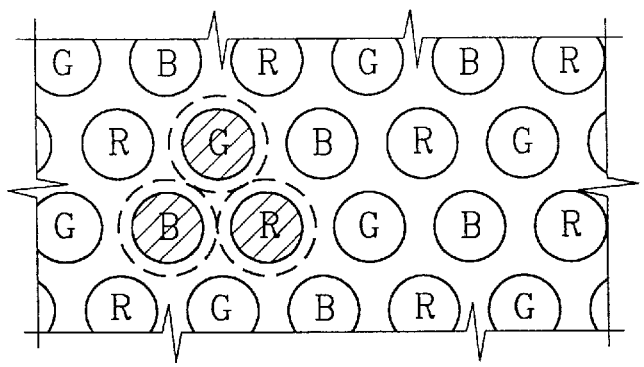
Figure 7C:
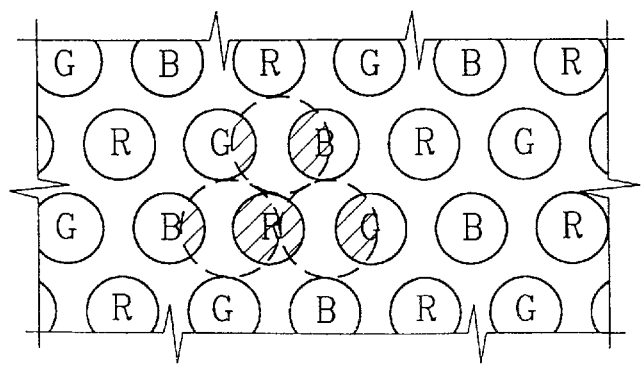

Accordingly, the electron beam does not exactly collide with fluorescent materials as shown in FIG. 7. Here, FIG. 7A shows the arrangement of the fluorescent materials of CRT 10 and FIG. 7B shows a case where the electron beam exactly collides with the fluorescent materials.

Figure 8:
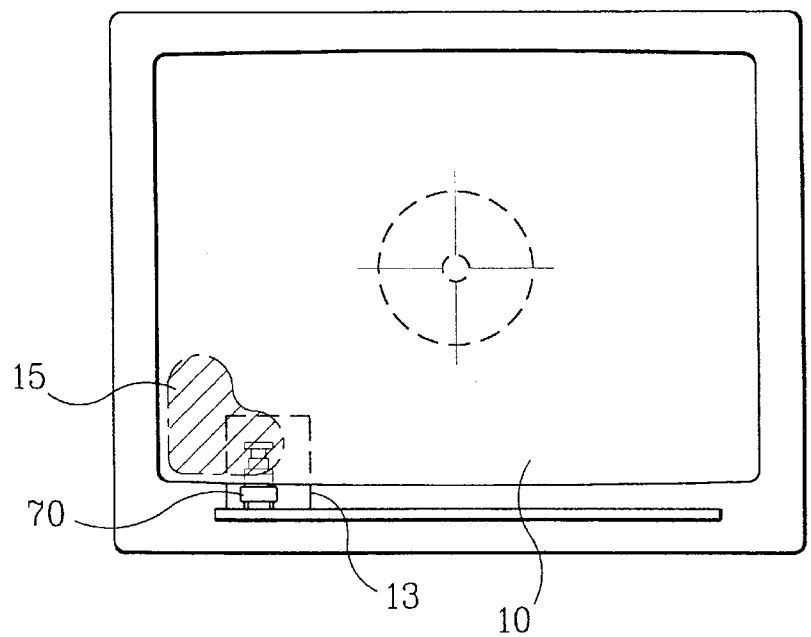
FIG. 8 is a view showing the stain of the screen of a prior cathode-ray tube.

As described above, if the electron beam abnormally collides with the fluorescent material of CRT 10, an image of an area where the electron beam abnormally collides with the fluorescent materials is displayed on CRT 10 as a stained phenomenon 15 as shown in FIG. 8.

Figure 9:
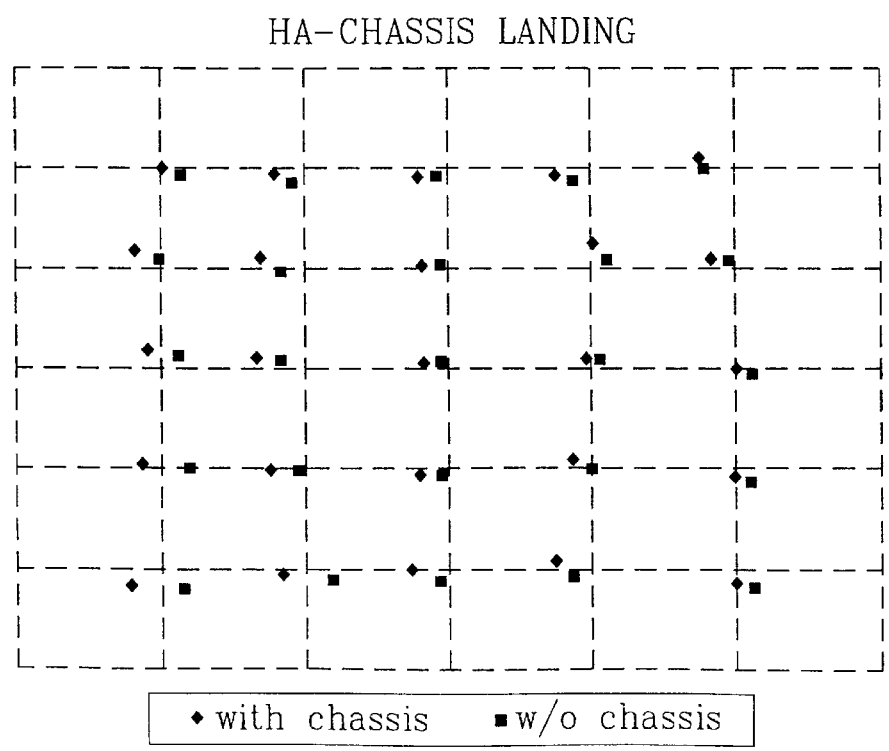
FIG. 9 is a simulation diagram showing the landing state of the electron beam in the prior cathode-ray tube shown in FIG. 1

FIG. 9 is a simulation diagram showing the landing state of the electron beam in the prior CRT shown in FIG. 1.

In FIG. 9, rectangular marks indicate a beam landing state of a case where linearity correction coil device 70 is installed in a location which is a fairly long distance from CRT 10, and lozenge marks indicate a beam landing state of a case where linearity correction coil device 70 is installed in close proximity to CRT 10 as shown in FIG. 6. In a case of dividing the screen of CRT 10 into 25 sections, beam landing positions of each of sections are identical with Table 1 described below. Here, FIG. 9 and Table 1 shows a simulation data corresponding to the G among the R, G and B.

Referring to Table 1, in sections P11, P16, P17, P21, P22 and P23 of which the distance between linearity correction coil device 70 and CRT 10 is short, the difference value of the distance between the rectangular mark and the lozenge mark is large. Accordingly, we know that the electron beam does not exactly collide with the fluorescent material in the area where linearity correction coil device 70 is installed in close proximity to CRT 10.

In addition, since linearity correction coil device 70 installed on printed circuit board 12 in the vertical way has to use a tape 78 and a film 79 to minimize a shake thereof, the cost of products increase. Also, the manufacturing process of linearity correction coil device 70 described above is complicated and the productivity thereof decreases because linearity correction coil device 70 needs numerous components.

TABLE 1

| section | CASE A | | CASE B | | |
| --- | --- | --- | --- | --- | --- |
| | horizontality | verticality | horizontality | verticality | distance |
| 1 | 0 | 0 | 7 | −2 | 7.3 |
| 2 | −10 | −2 | −4 | −5 | 6.7 |
| 3 | −9 | −3 | −4 | −4 | 5.1 |
| 4 | −8 | −2 | −4 | −6 | 5.7 |
| 5 | −8 | 4 | −6 | 0 | 4.5 |
| 6 | −8 | 5 | 0 | 2 | 8.5 |
| 7 | −17 | 2 | −10 | −1 | 7.6 |
| 8 | −8 | 1 | −2 | −1 | 6.3 |
| 9 | 0 | 5 | 5 | 2 | 5.8 |
| 10 | −6 | 2 | −1 | 0 | 5.4 |
| 11 | −6 | 7 | 5 | 4 | 11.4 |
| 12 | −16 | 2 | −8 | 0 | 8.2 |
| 13 | −8 | 1 | −1 | 0 | 7.1 |
| 14 | 0 | 3 | 5 | 1 | 5.4 |
| 15 | 0 | −1 | 4 | −4 | 5.0 |
| 16 | −8 | 2 | 7 | −1 | 15.3 |
| 17 | −14 | 1 | −2 | −1 | 12.2 |
| 18 | −11 | 1 | −2 | −1 | 9.2 |
| 19 | −6 | 3 | 1 | 0 | 7.6 |
| 20 | 1 | −3 | 6 | −6 | 5.8 |
| 21 | −11 | −12 | 10 | −14 | 21.1 |
| 22 | −10 | −1 | 8 | −5 | 18.2 |
| 23 | −15 | 0 | −1 | −4 | 14.6 |
| 24 | −16 | 3 | −8 | −2 | 9.4 |
| 25 | −1 | 6 | 6 | −8 | 7.3 |

Figure 10:
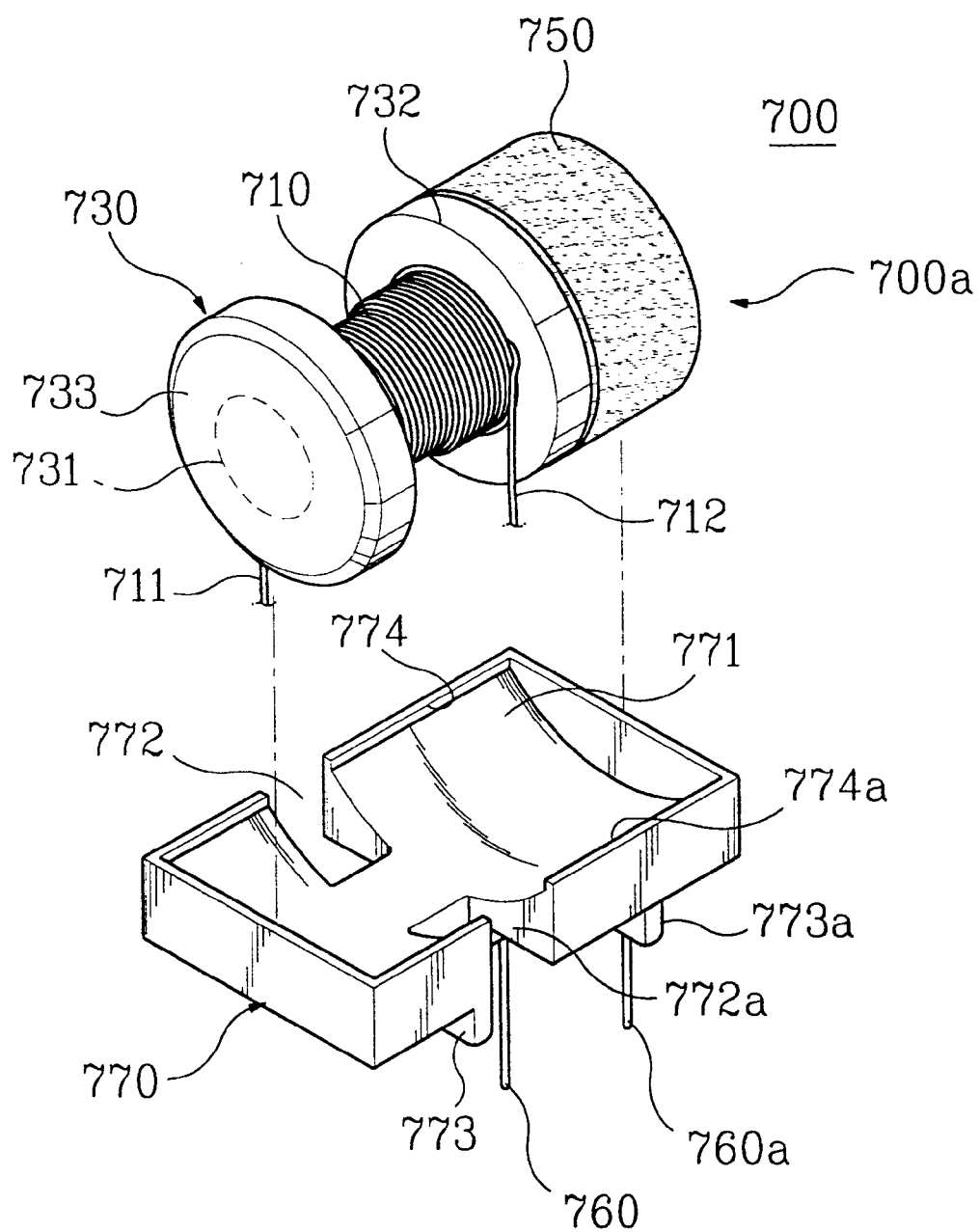
FIG. 10 is an exploded view of a linearity correction coil device according to an embodiment of the present invention.

FIG. 10 is an exploded view of a linearity correction coil device according to an embodiment of the present invention.

Referring to FIG. 10, a linearity correction coil device 700 according to the present invention has a linearity correction coil 700a and a case 770 for supporting linearity correction coil device 700.

The linearity correction coil 700a has a magnetic core 730 having a first flange 732, a second flange 733 and a winding core portion 731 for combining first and second flanges 732 and 733, a coil 710 wound around winding core portion 731 and a permanent magnet 750 combined with first flange 732. At this time, the diameter of first flange 732 is identical with the diameters of second flange 733 and permanent magnet 750, respectively.

Also, since winding core portion 731, first flange 732 and second flange 733 are formed in a body, it is able to prevent coil 710 wound around winding core portion 731 from breaking away.

An upper surface 771 of case 770, on which linearity correction coil 700a is placed, is formed in a curved surface corresponding to a curved surface of first flange 732, second flange 733 and permanent magnet 750 to stably support linearity correction coil 700a.

Additionally, projections 773 and 773a for supporting case 770 of which linearity correction coil 700a is put on the upper surface 771 thereof are formed in a body with case 770 on a lower surface of case 770.

Also, first and second contact pins 760 and 760a which are respectively connected with first and second end portions 711 and 712 of coil 710 are formed on the lower surface of case 770 in which projections 773 and 773a are formed.

Also, guide grooves 772 and 772a are formed in both peripheral portions of a body of case 770 to minimize length of each of first and second end portions 711 and 712 of coil 710 which are respectively connected with contact pins 760 and 760a.

Figure 11:
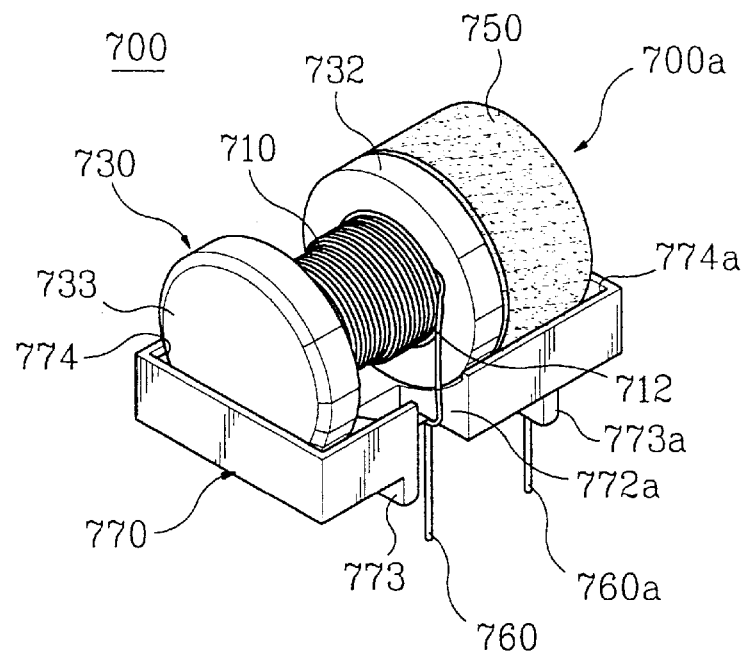
FIG. 11 is a side view of the linearity correction coil device according to the embodiment of the present invention shown in FIG. 10.
Figure 12:
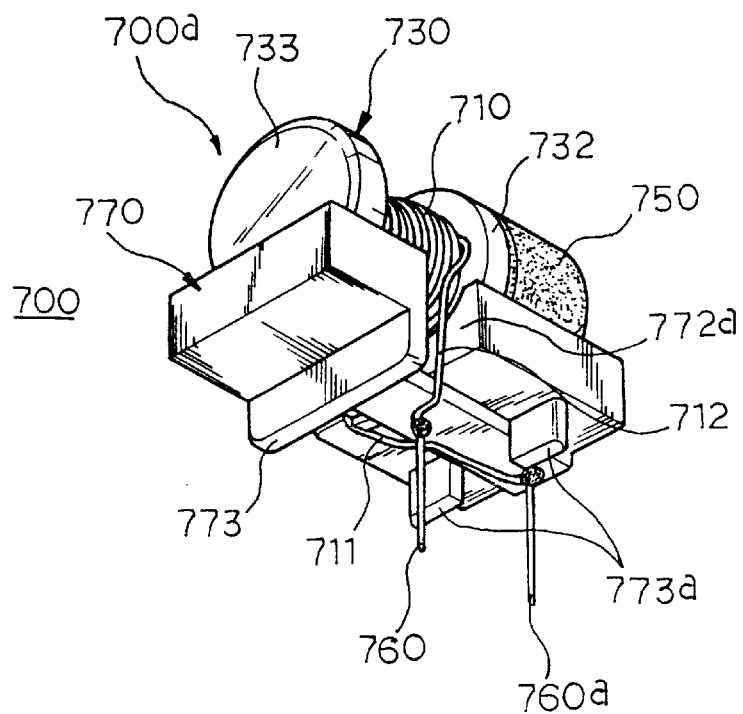
FIG. 12 is a bottom view of the linearity correction coil device according to the embodiment of the present invention shown in FIG. 11.

FIG. 11 is a side view of the linearity correction coil device according to the embodiment of the present invention shown in FIG. 10 and FIG. 12 is a bottom view of the linearity correction coil device according to the embodiment of the present invention shown in FIG. 11.

Referring to FIGS. 11 and 12, linearity correction coil 700a is put on upper surface 771 of case 770. As shown in FIG. 12, first end portion 711 of coil 710 is connected with second contact 760a through first guide groove 772 and second end portion 712 of case 710 is connected with first contact pin 760 through second guide groove 772a. On the contrary, first and second end portions 711 and 712 may be connected with first and second contact pins 760 and 760a, respectively.

Figure 13:
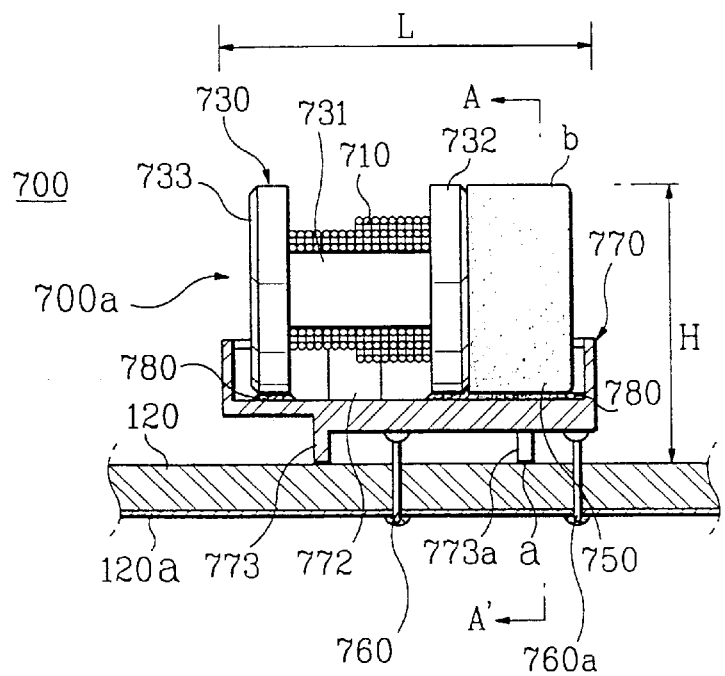
FIG. 13 is a side sectional view of the linearity correction coil device according to the embodiment of the present invention shown in FIG. 11.
Figure 14:
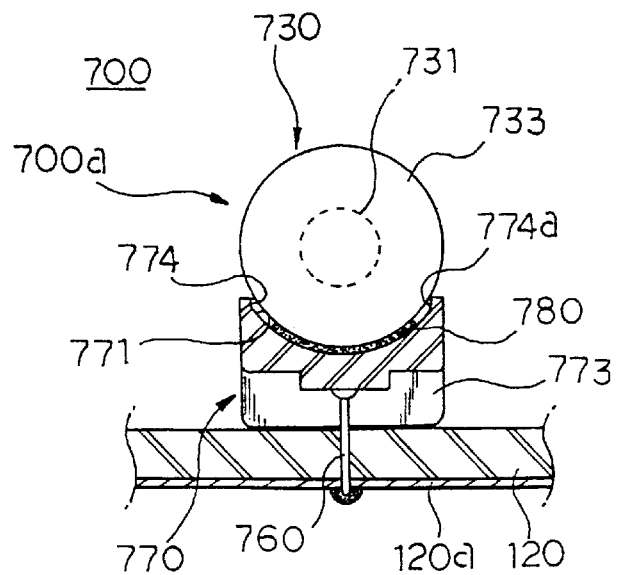
FIG. 14 is a front sectional view of the linearity correction coil device according to the embodiment of the present invention shown in FIG. 13.
Figure 15:
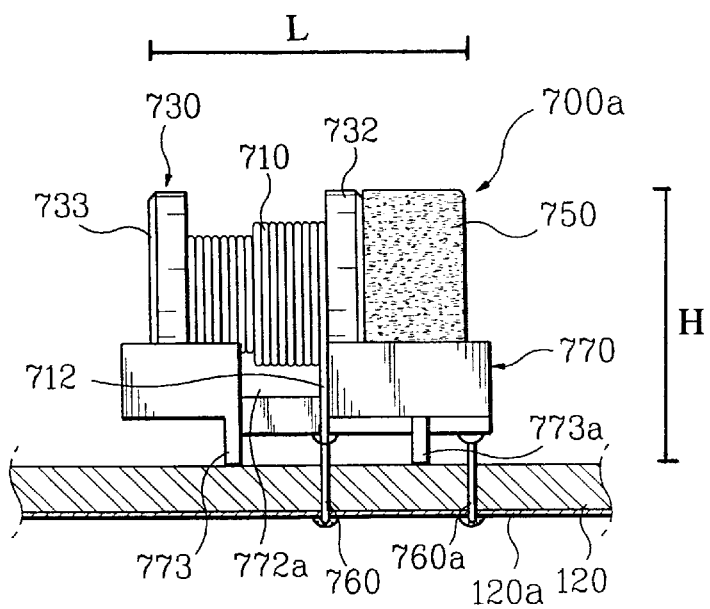
FIG. 15 is side view of the linearity correction coil device according to the embodiment of the present invention shown in FIG. 13.

FIG. 13 is a side sectional view of the linearity correction coil device according to the embodiment of the present invention shown in FIG. 11, FIG. 14 is a front sectional view of the linearity correction coil device according to the embodiment of the present invention shown in FIG. 13, and FIG. 15 is side view of the linearity correction coil device according to the embodiment of the present invention shown in FIG. 13.

Referring to FIGS. 13 to 15, linearity correction coil 700a put on upper surface 771 of case 770 is bonded to case 770 by silicon adhesive 780. Case 770 which supports linearity correction coil 700a is installed on a printed circuit board 120 arranged in a lower portion of the CRT of the video display apparatus.

At this time, linearity correction coil device 700 is horizontally installed on printed circuit board 120 for a vertical length H to have a shorter length than a horizontal length L thereof.

In other words, linearity correction coil device 700 is installed on printed circuit board 120 to minimize the length between lowest portion a of case 770 and highest portion b of permanent magnet 750.

In addition, first and second contact pins 760 and 760a of case 770 are electrically connected with a wire pattern 120a printed in printed circuit board 120 through via holes of printed circuit board 120.

Figure 16:
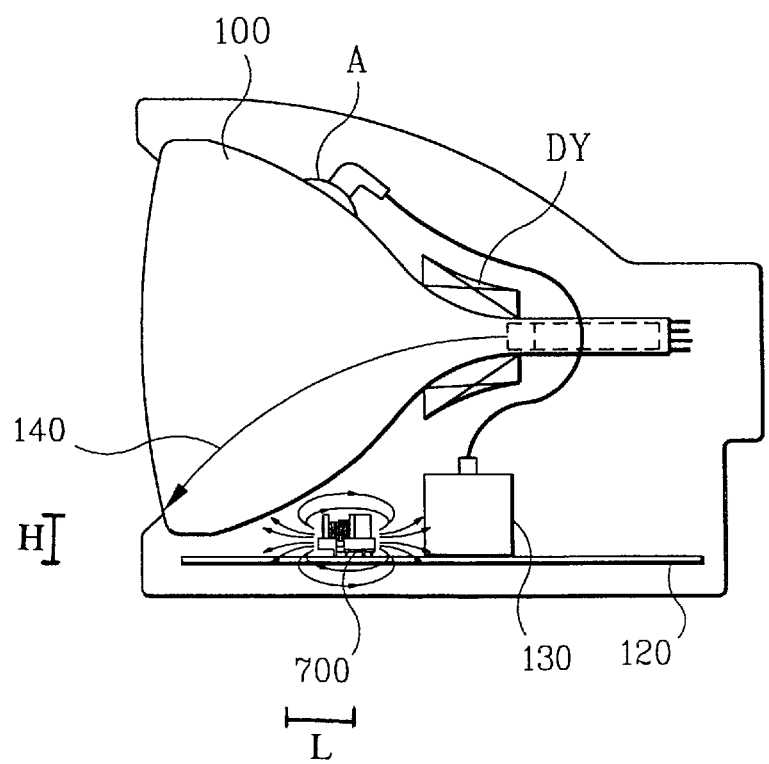
FIG. 16 is a view showing a configuration of the video display apparatus which adopts the linearity correction coil device according to the embodiment of the present invention shown in FIG. 15.

FIG. 16 is a view showing a configuration of the video display apparatus which adopts the linearity correction coil device according to the embodiment of the present invention shown in FIG. 15.

Referring to FIG. 16, the video display apparatus has a CRT 100 for displaying video, a deflecting yoke DY for deflecting an electron beam 140, an anode for applying a high voltage to CRT 100, printed circuit board 120, a flyback transformer 130 and linearity correction coil device 700 for correcting the linearity of electron beam 140.

At this time, as shown in FIG. 16, linearity correction coil device 700 is horizontally installed on printed circuit board 120 for vertical length H which vertically intersects with a progressive direction of electron beam 140 to have a shorter length than horizontal length L which is parallel with the progressive direction of electron beam 140.

Accordingly, the distance between linearity correction coil device 700 and CRT 100 becomes more distant than a case where linearity correction coil device 700 is installed in the vertically way. Therefore, magnetic field generated from linearity correction coil device 700 does not exert any influence on the progressive direction of electron beam 140.

Figure 17:
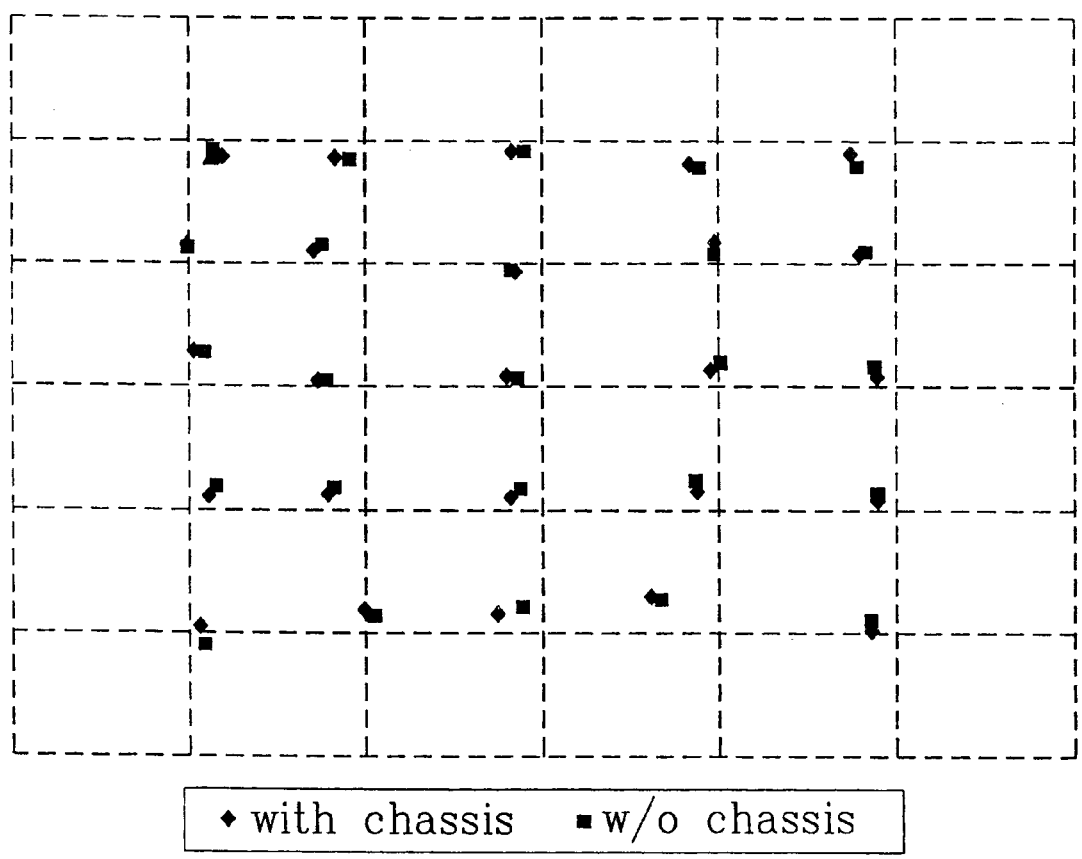
FIG. 17 is a simulation diagram showing the landing state of the electron beam in the cathode-ray tube which adopts the linearity correction coil device according to the embodiment of the present invention shown in FIG. 15.

FIG. 17 is a simulation diagram showing the landing state of the electron beam in the cathode-ray tube which adopts the linearity correction coil device according to the embodiment of the present invention shown in FIG. 15.

In FIG. 17, rectangular marks indicate a beam landing state of a case where linearity correction coil device is installed in a location which is a fairly long distance from CRT 100, and lozenge marks indicate a beam landing state of a case where linearity correction coil device is installed as shown in FIG. 16. In a case of dividing the screen of CRT 100 into 25 sections, beam landing positions of each of sections are identical with Table 2 described below.

Referring to Table 2, in sections P11, P16, P17, P21, P22 and P23 of which the distance between linearity correction coil device 700 and CRT 100 is short, the rectangular mark appears in close proximity to the lozenge mark.

Accordingly, we know that the electron beam exactly collides with the fluorescent material even though linearity correction coil device 700 is installed in close proximity to CRT 100.

TABLE 2

| section | CASE C | | CASE D | | |
|---|---|---|---|---|---|
| | horizontality | verticality | horizontality | verticality | distance |
| 1 | 7 | −2 | 8 | −3 | 1.4 |
| 2 | −3 | −6 | −4 | −7 | 1.4 |
| 3 | −4 | −7 | −7 | −7 | 3.0 |
| 4 | −7 | −8 | −9 | −8 | 2.0 |
| 5 | −13 | −3 | −15 | −2 | 2.2 |
| 6 | −1 | 4 | −1 | 4 | 0 |
| 7 | −10 | 1 | −11 | 1 | 1.0 |
| 8 | −4 | −1 | −5 | −2 | 1.4 |
| 9 | 0 | 3 | −3 | 1 | 3.6 |
| 10 | −9 | 1 | −10 | 2 | 1.4 |
| 11 | 3 | 9 | 4 | 10 | 1.4 |
| 12 | −9 | 4 | −9 | 4 | 0 |
| 13 | −4 | 4 | −5 | 3 | 1.4 |
| 14 | −1 | 6 | −2 | 5 | 1.4 |
| 15 | −5 | 3 | −8 | 2 | 3.2 |
| 16 | 5 | 7 | 4 | 9 | 2.2 |
| 17 | −4 | 7 | −5 | 7 | 1.0 |
| 18 | −5 | 7 | −8 | 4 | 4.2 |
| 19 | −5 | 7 | −7 | 7 | 2.0 |
| 20 | −4 | 3 | −6 | 3 | 2.0 |
| 21 | 2 | −4 | 1 | 1 | 5.1 |
| 22 | 2 | 7 | 1 | 7 | 1.0 |
| 23 | −4 | 7 | −9 | 6 | 5.1 |
| 24 | −13 | 8 | −16 | 7 | 3.2 |
| 25 | −3 | 3 | −5 | 1 | 2.8 |

In the linearity correction coil device and video display apparatus using the same according to the present invention, the linearity correction coil device for compensating the linearity of the electron beam is horizontally installed on a printed circuit board of the cathode-ray tube for the vertical length which vertically intersects with a progressive direction of the electron beam to have a shorter length than a horizontal length which is parallel with the progressive direction of the electron beam. Accordingly, it is able to prevent the electron beam from running off the normal orbit by the magnetic field generated from the linearity correction coil device. Therefore, since the electron beam exactly collides with the fluorescent material, it is able to prevent the stained image from showing on the CRT.

In addition, the linearity correction coil device does not use the tape and the film to minimize shake thereof. Accordingly, since the manufacturing process of the linearity correction coil device is simplified, the productivity and the cost of the linearity correction coil device decrease.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A video display apparatus using a linearity correction coil device, said apparatus comprising:
    a cathode-ray tube for generating an electron beam;
    a printed circuit board for said cathode-ray tube;
    a deflecting yoke for deflecting the electron beam; and
    a linearity correction coil device for compensating a linearity of the electron beam;
    wherein said linearity correction coil device exhibiting a central axis is installed on said printed circuit board for said cathode-ray tube, and wherein said axis of said linearity correction coil is equidistant at al points from a surface of said printed circuit board and is essentially parallel to the direction of the electron beam prior to deflection of said electron beam by said deflecting yoke, said linearity correction coil by a vertical length parallel to said axis and a horizontal length, said vertical length being shorter than said horizontal length.

2. The apparatus as claimed in claim 1, wherein said linearity correction coil device comprises;
    a linearity correction coil including a magnetic core having a first flange at one end portion of said magnetic core, a second flange at another end portion of said magnetic core, and a winding core portion disposed between said first flange and said second flange; a winding wound around said winding core portion of said magnetic core; and a permanent magnet connected to either said first flange or said second flange; and
    a case supporting said linearity correction coil, said linearity correction coil placed on an upper surface of said case and having two contact pins, with a first one of said two contact pins being in electrical contact with a first end portion of said winding and with a second one of said two contact pins being in electrical contact with a second end portion of said winding.

3. The apparatus as claimed in claim 2, wherein the upper surface of said case on which said linearity correction coil is placed is formed in a curved surface corresponding to a curved surface of said first flange, said second flange and said permanent magnet.

4. The apparatus as claimed in claim 2, wherein said case has guide grooves formed in both peripheral portions of a body thereof to guide both end portions of said winding respectively connected with said contact pins.

5. The apparatus as claimed in claim 2, wherein said case has projections formed on the surface in which said contact pins are formed to support said case on which said linearity correction coil is placed.

6. The apparatus as claimed in claim 2, wherein said linearity correction coil is bonded to the upper surface of said case by means of an adhesive.

7. A video display apparatus using a linearity correction coil device, said apparatus comprising:
    a cathode-ray tube for generating an electron beam;
    a deflecting yoke for deflecting the electron beam; and
    a linearity correction coil device for compensating a linearity of the electron beam;
    wherein said linearity correction coil device comprises:
        a linearity correction coil including a magnetic core having a first flange at one end portion of said magnetic core, a second flange at another end portion of said magnetic core, and a winding core portion disposed between said first flange and said second flange; a winding wound around said winding core portion of said magnetic core; and a permanent magnet connected to either said first flange or said second flange, said linearity correction coil having an axis extending through the center of said winding core; and
        a case supporting said linearity correction coil placed on an upper surface of said case and having contact pins disposed between end portions of said winding and said printed circuit board, wherein said linearity correction coil device is installed parallel to a surface of a printed circuit board for said cathode-ray tube so that each point on an axis of said linearity correction coil is of equal distance from a surface of said printed circuit board.

8. The apparatus as claimed in claim 7, wherein the upper surface of said case on which said linearity correction coil is placed has a curved surface having a radius of curvature equal to a radius of curvature of said first flange, said second flange and said permanent magnet.

9. The apparatus as claimed in claim 7, wherein said case has guide grooves formed in both peripheral portions of a body thereof to guide both end portions of said winding respectively connected with said contact pins.

10. The apparatus as claimed in claim 7, wherein said case has projections formed on the surface in which said contact pins are formed to support said case on which said linearity correction coil is placed.

11. The apparatus as claimed in claim 7, wherein said linearity correction coil is bonded to the upper surface of said case by means of an adhesive.

12. A video display apparatus using a linearity correction coil device, said apparatus comprising:
    a cathode-ray tube for generating an electron beam;
    a deflecting yoke for deflecting the electron beam; and
    a linearity correction coil device for compensating a linearity of the electron beam;
    wherein said linearity correction coil device comprises:
        a linearity correction coil including a magnetic core having a first flange at one end portion of said magnetic core, a second flange at another end portion of said magnetic core, and a winding core portion for combining said first flange and said second flange; a winding wound around said winding core portion of said magnetic core; and a permanent magnet combined with either said first flange or said second flange, said first flange, said second flange, said magnetic core, said winding, and said permanent magnet having an axis extending through the center of each part; and a case for supporting said linearity correction coil placed on an upper surface of said case and having guide grooves formed in both peripheral portions of a body thereof to guide both end portions of said winding, a pair of contact pins formed in a lower surface of said linear correction coil to be electrically connected with corresponding end portions of said winding via said guide grooves, said case further comprising a plurality of projections extending from a lower surface of said case for supporting said case containing said coil thereon, wherein said linearity correction coil device is installed on a printed circuit board for said cathode-ray tube so that said axis extending through the center of said winding is equidistant from a surface of said printed circuit board.

13. The apparatus as claimed in claim 12, wherein said linearity correction coil is bonded to the upper surface of said case by means of an adhesive.

14. A linearity correction coil device, said device comprising:

a linearity correction coil including a magnetic core having a first flange at one end portion of said magnetic core, a second flange at another end portion of said magnetic core, and a winding core portion disposed between said first flange and said second flange; a winding wound around said winding core portion of said magnetic core; and a permanent magnet attached to either said first flange or said second flange; and a case for supporting said linearity correction coil placed on an upper surface of said case, said case being perforated by a pair of guide grooves, said linearity correction coil having a first end and a second end, said first end of said correction coil being electrically connected to a first contact pin through one of said pair of guide grooves, said second end of said linearity correction coil being electrically connected to a second contact pin via another of said pair of guide grooves, said case being supported by a pair of projections extending from a bottom surface of said case.

15. A video display apparatus, comprising:

a cathode-ray tube from which an electron beam emanates from a neck of said tube;

a control circuit mounted on a printed circuit board positioned outside of said cathode-ray tube for electrically controlling said video display device;

a deflection yoke for deflecting said electron beam to fully illuminate a display screen located at a front of said tube;

a linearity correction coil disposed on said printed circuit board, said coil comprising a magnetic core having a first flange at one end portion of said magnetic core, a second flange at another end portion of said magnetic core, and a winding core portion for combining said first flange and said second flange, a winding wound around said winding core portion of said magnetic core, and a permanent magnet combined with either said first flange or said second flange, with said first flange, said winding core portion, said second flange and said permanent magnetic being coaxially arranged along an axis extending through a center of said coil, said axis being parallel to said electron beam prior to deflection by said yoke and said coil producing a magnetic field that is parallel to said axis; and a case supporting said linearity correction coil, said linearity correction coil being placed on a surface of said case and having two contact pins, with a first one of said two contact pins being in electrical contact with a first end portion of said winding and with a second one of said two contact pins being in electrical contact with a second end portion of said winding.

* * * * *